US009153611B2

(12) United States Patent
Higashitsutsumi et al.

(10) Patent No.: US 9,153,611 B2
(45) Date of Patent: Oct. 6, 2015

(54) DOUBLE-SIDED OPTICAL SENSOR FOR A CAMERA MODULE

(75) Inventors: Yoshihito Higashitsutsumi, Kanagawa (JP); Satoshi Shimizu, Kanagawa (JP); Isaya Kitamura, Kumamoto (JP); Masami Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 257 days.

(21) Appl. No.: 13/814,699

(22) PCT Filed: Aug. 11, 2011

(86) PCT No.: PCT/JP2011/004561
§ 371 (c)(1),
(2), (4) Date: Mar. 28, 2013

(87) PCT Pub. No.: WO2012/023272
PCT Pub. Date: Feb. 23, 2012

(65) Prior Publication Data
US 2013/0240714 A1    Sep. 19, 2013

(30) Foreign Application Priority Data

Aug. 20, 2010 (JP) .................. 2010-185476

(51) Int. Cl.
*H01L 27/00* (2006.01)
*H04N 3/14* (2006.01)
*H01L 27/146* (2006.01)
(Continued)

(52) U.S. Cl.
CPC .......... *H01L 27/14601* (2013.01); *G02B 5/201* (2013.01); *H01L 27/14618* (2013.01); *H01L 27/14621* (2013.01); *H01L 27/14625* (2013.01); *H04N 1/00307* (2013.01); *H04N 5/2253* (2013.01); *H04N 5/2254* (2013.01); (Continued)

(58) Field of Classification Search
CPC .................................. H01L 27/14621
USPC ................. 250/208.1, 226; 348/273
See application file for complete search history.

(56) References Cited

U.S. PATENT DOCUMENTS 7,297,570 B2 * 11/2007 Kim ................................ 438/70
2001/0031912 A1 * 10/2001 Adler ............................ 600/109
(Continued)

FOREIGN PATENT DOCUMENTS

JP    2002-198463    7/2002
JP    2003-250071    9/2003
(Continued)

OTHER PUBLICATIONS

International Search Report; International Application No. PCT/JP2011/004561; International Filing Date: Nov. 8, 2011; Completion of the International Search Report: Aug. 29, 2011. (PCT/ISA/210).
(Continued)

*Primary Examiner* — Thanh Luu
(74) *Attorney, Agent, or Firm* — Sony Corporation

(57) ABSTRACT

An optical sensor is described herein. By way of example, the optical sensor comprises a first light filter on a first light-receiving surface of an image sensor, and a second light filter on a second light-receiving surface of the image sensor. The second light-receiving surface is on an opposite side of the image sensor from the first light-receiving surface. The characteristics of the first light filter are different than characteristics of the second light filter.

19 Claims, 16 Drawing Sheets

(51) Int. Cl.
   *G02B 5/20*   (2006.01)
   *H04N 1/00*   (2006.01)
   *H04N 5/225*  (2006.01)
   *H04N 9/04*   (2006.01)
   *H04N 9/07*   (2006.01)

(52) U.S. Cl.
   CPC ............... *H04N5/2257* (2013.01); *H04N 9/04* (2013.01); *H04N 9/07* (2013.01); *H01L 2924/0002* (2013.01)

(56) References Cited

U.S. PATENT DOCUMENTS

2007/0272827 A1* 11/2007 Heo et al. ............... 250/208.1
2011/0228097 A1*  9/2011 Motta ..................... 348/164
2013/0063641 A1*  3/2013 Venezia et al. .......... 348/308

FOREIGN PATENT DOCUMENTS

| | | |
|---|---|---|
| JP | 2005-526454 | 9/2005 |
| JP | 2007-292722 | 11/2007 |
| JP | 2007-306387 | 11/2007 |
| JP | 2008-072423 | 3/2008 |
| JP | 2008-210846 | 9/2008 |
| JP | 2008-311280 | 12/2008 |
| JP | 2009-064839 | 3/2009 |
| JP | 2010-230879 | 10/2010 |
| WO | WO-2010/100896 | 9/2010 |
| WO | WO-2011/043025 | 4/2011 |

OTHER PUBLICATIONS

Notification of transmittal of the International Search Report and Written Opinion of the International Searching Authority; International Application No. PCT/JP2011/004561; International Filing Date: Nov. 8, 2011; Completion Date: Aug. 29, 2011; Mailing Date: Sep. 6, 2011. (PCT/ISA/220 and PCT/ISA/237).

* cited by examiner

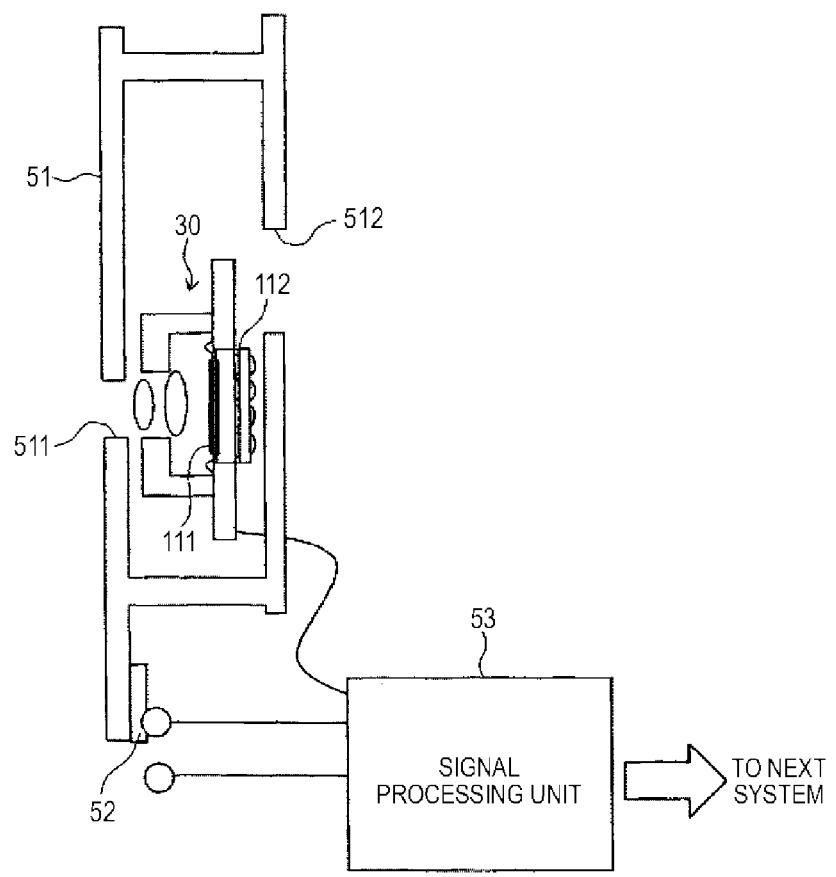

DOUBLE-SIDED OPTICAL SENSOR FOR A CAMERA MODULE

TECHNICAL FIELD

The present invention relates to an optical sensor such as a CMOS image sensor (CIS), and a lens module, and a camera module.

BACKGROUND ART

In image pickup apparatuses including a generic CMOS image sensor, an imaging lens is used, and a solid-state imaging device is disposed at a focal position of the imaging lens.

Then, light, which originates from a subject and is captured by the imaging lens, is optically processed in an optical system so as to be easily converted into an electric signal in the solid-state imaging device. Thereafter, the light is guided into the photoelectric conversion side of the solid-state imaging device, and an electric signal, which can be obtained by photoelectric conversion through an imaging device, is subjected to a predetermined signal processing through a circuit for signal processing at a latter stage (for example, see "Introduction to CCD Camera Technology2, Takemura Yasuo, first edition, Corona Co., August 1998, p. 2-4).

These kinds of image pickup apparatuses are not only used as camera systems, each of which is a single unit, such as digital still cameras, but also, recently, have been used by being built in small portable devices such as mobile phones.

Hence, in order for the image pickup apparatuses to be built into the mobile phones and the like, there has been a strong demand for reduction in size, weight, and cost of the image pickup apparatus.

That is, by building small, lightweight, and low-cost image pickup apparatuses therein, it is possible to significantly contribute to reduce the size, the weight, and the cost of the small portable devices such as mobile phones.

Incidentally, generic image sensors are unable to capture images on both sides thereof by using a single sensor, but in recent years, as backside illumination image sensors, in which light is made to be incident from the back side thereof on which the elements and the like are not formed, have been newly developed, some image sensors have detection abilities on both sides thereof.

However, this sensor is thin, and thus it is necessary for the sensor to have an opaque support substrate called a support silicon (Si). For this reason, it is difficult to use both sides thereof as sensors.

Further, such an object, referred to as an in-camera or an out-camera, needs an individual interface with an ISP, an application processor, and a baseband chip. For this reason, double costs are needed for adjustment and inspection of each connection component.

Further, as a new method of fabricating a camera module with an intention of reducing costs, there is a wafer level camera module. In this method, a wafer-like lens array is attached to a sensor wafer together with a wafer, and the wafer is cut together with the lens into each individual piece, thereby considerably reducing the cost thereof.

However, in this structure, when the wafer lenses are attached to both sides of the double-sided sensor, the extraction electrodes cannot be formed.

DISCLOSURE OF THE INVENTION

An optical sensor is described herein. By way of example, the optical sensor comprises a first light filter on a first light-receiving surface of an image sensor, and a second light filter on a second light-receiving surface of the image sensor. The second light-receiving surface is on an opposite side of the image sensor from the first light-receiving surface. The characteristics of the first light filter are different than characteristics of the second light filter.

BRIEF DESCRIPTION OF DRAWINGS

FIG. 16 is a diagram illustrating an exemplary configuration of a camera module according to an eighth embodiment.

BEST MODE FOR CARRYING OUT THE INVENTION

Hereinafter, embodiments will be described with reference to the drawings.

Figure 1:
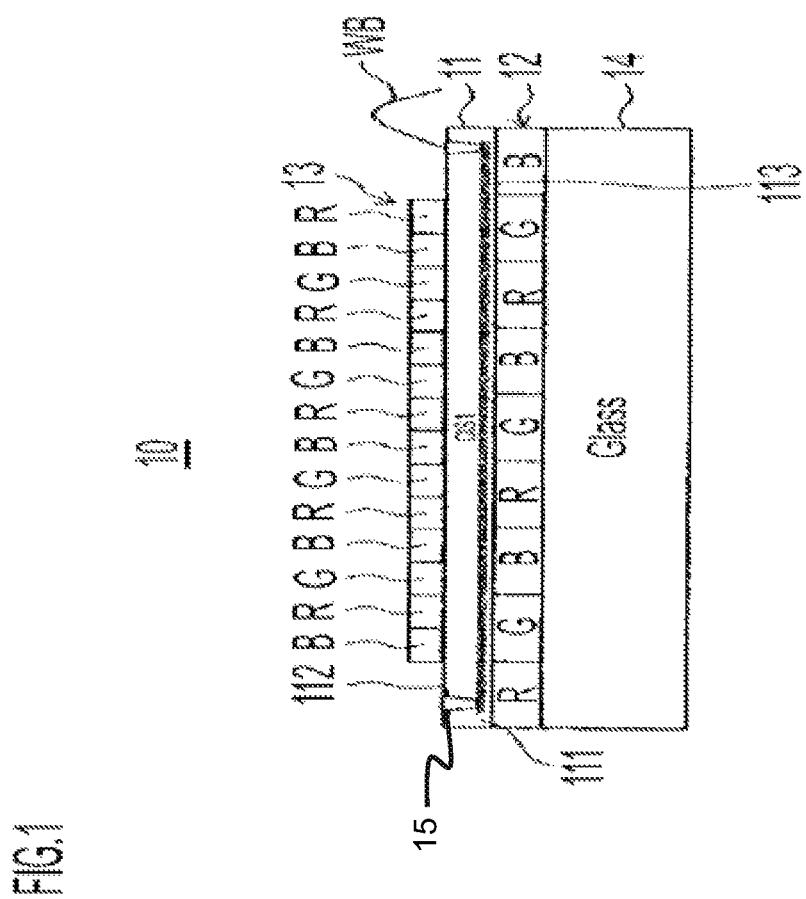
FIG. 1 is a diagram illustrating a first exemplary configuration of an optical sensor (solid-state imaging device) according to a first embodiment.

FIG. 1 is a diagram illustrating a first exemplary configuration of an optical sensor (solid-state imaging device) according to a first embodiment.

In the embodiment, as an example of the optical sensor, a CMOS image sensor (CIS) is employed.

An optical sensor 10 according to the first embodiment includes a sensor board 11, a first color filter 12, a second color filter 13, and a transparent supporting plate 14.

The sensor board 11 has a first light receiving surface 111 formed on the front side thereof, has a second light receiving surface 112 formed on the back side thereof, and is formed as a double-sided sensor board capable of forming subject images on the first light receiving surface 111 and the second light receiving surface 112.

The first color filter 12 is disposed (formed) on the first light receiving surface 111 side.

The second color filter 13 is disposed (formed) on the second light receiving surface 112 side.

The transparent supporting plate 14 is formed by an optically transparent glass substrate, and is bonded to the first color filter 12 by an optically transparent adhesive so as to support the first light receiving surface 111 side of the sensor board 11 through the first color filter 12.

Further, in the sensor board 11, a connection pad electrode 15, which is connected to a wire 113 through a via, is formed on the second light receiving surface 112 side.

In the first color filter 12, color filters of R (red), G (green), and B (blue) as three primary colors have, for example, the Bayer array, and are formed in an array shape as an on-chip color filter (OCCF).

In the second color filter 13, color filters of R (red), G (green), and B (blue) as three primary colors have the Bayer array, and are formed in an array shape as the OCCF.

However, in the first embodiment, the first color filter 12 and the second color filter 13 are different in the layout and the size thereof.

Specifically, as shown in FIGS. 2(A) and 2(B), the layouts and the sizes thereof are set such that the first color filter 12 on the first light receiving surface 111 side functions as a high-sensitivity sensor and the second color filter 13 on the second light receiving surface 112 side functions as a high resolution sensor.

As described above, the OCCFs (on-chip color filters), which are mounted on the first light receiving surface 111 and the second light receiving surface 112, may have a different pattern if the pixel units thereof are the same.

Figure 2:
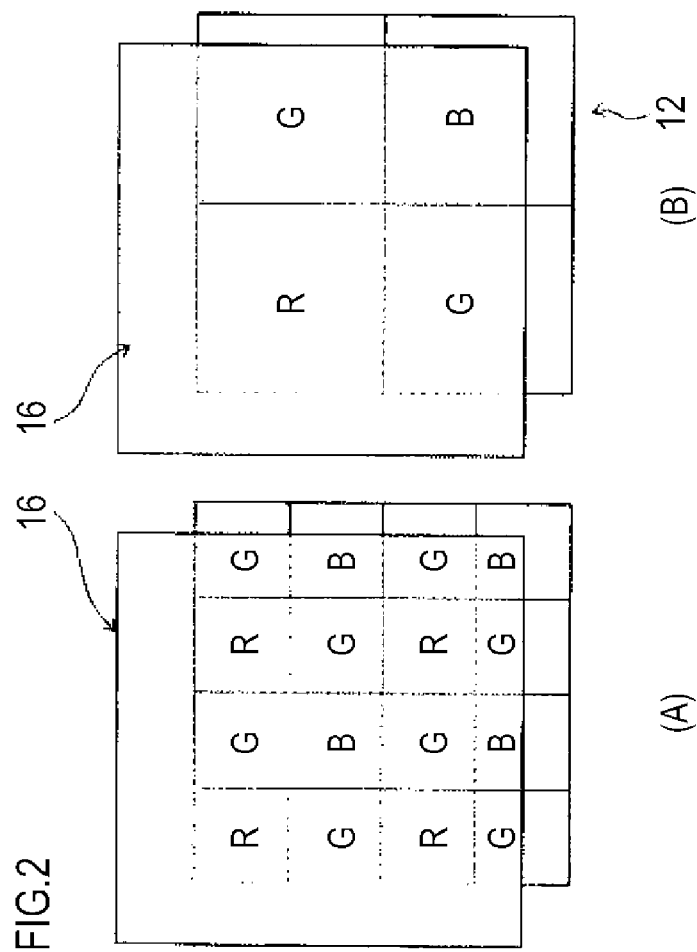
FIG. 2 is a diagram illustrating first exemplary configurations of a first color filter and a second color filter according to the present embodiment.

In the example of FIG. 2, in the first color filter 12, one color filter R, G, G, or B is formed to have the size corresponding to the pixels of 2×2, and is thus formed to function as a high-sensitivity sensor having a pixel mixture function.

Meanwhile, in the second color filter, one color filter R, G, G, or B is formed to have the size corresponding one-to-one with each pixel, and is thus formed to function as a high resolution sensor.

In the example of FIG. 2, infrared cut filters (IRCF) 16 are respectively formed to overlap with the first color filter 12 and the second color filter 13.

Further, the color filters are not limited to the Bayer pattern, IR cut filters and color filters totally independent of each other can be formed on the first light receiving surface 111 and the second light receiving surface 112.

For example, as shown in FIGS. 3(A) and 3(B), in the case of adopting a filter configuration used in combination with a night vision camera, the second color filter 13 of the second light receiving surface 112 is formed, similarly to FIG. 2, as a high resolution Bayer type in combination with the normal IRCF.

The first color filter 12 on the first light receiving surface 111 side is formed as an OCCF on which the IRCF is not mounted since there are pixels including IR filters 17. Even in this case, a pixel mixture high-sensitivity sensor is formed.

Figure 3:
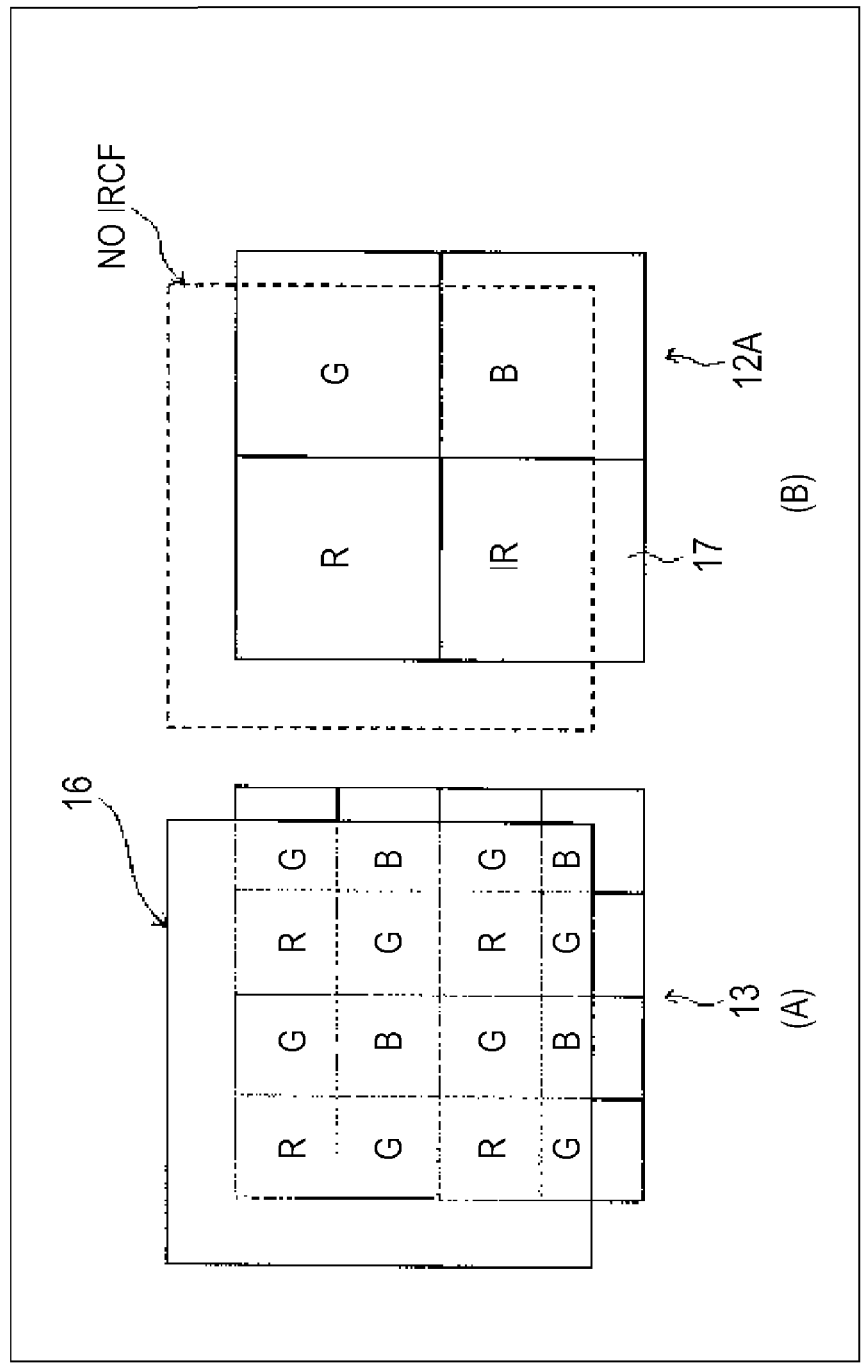
FIG. 3 is a diagram illustrating second exemplary configurations of the first color filter and the second color filter according to the present embodiment.

In the cases shown in FIGS. 2 and 3, for example, the OCCF with the RGB Bayer pattern is formed on the back side of the sensor of which the number of pixels is 8 million, and the OCCF with the Bayer pattern, in which four pixels are shared for each color, is formed on the front side thereof.

With such a configuration, the resolution of the front side thereof is made to be low, but the sensitivity is increased by the pixel sharing. Hence, by employing a small micro lens array, a camera with a lower height is realized, and it is possible to provide a camera for a different use. In the case of the OCCF of which both sides are the same, there is an advantage that it is not necessary to change the signal processing at the latter stage.

FIGS. 4(A) to 4(F) are diagrams illustrating a basic method of fabricating the optical sensor according to the first embodiment.

Figure 4:
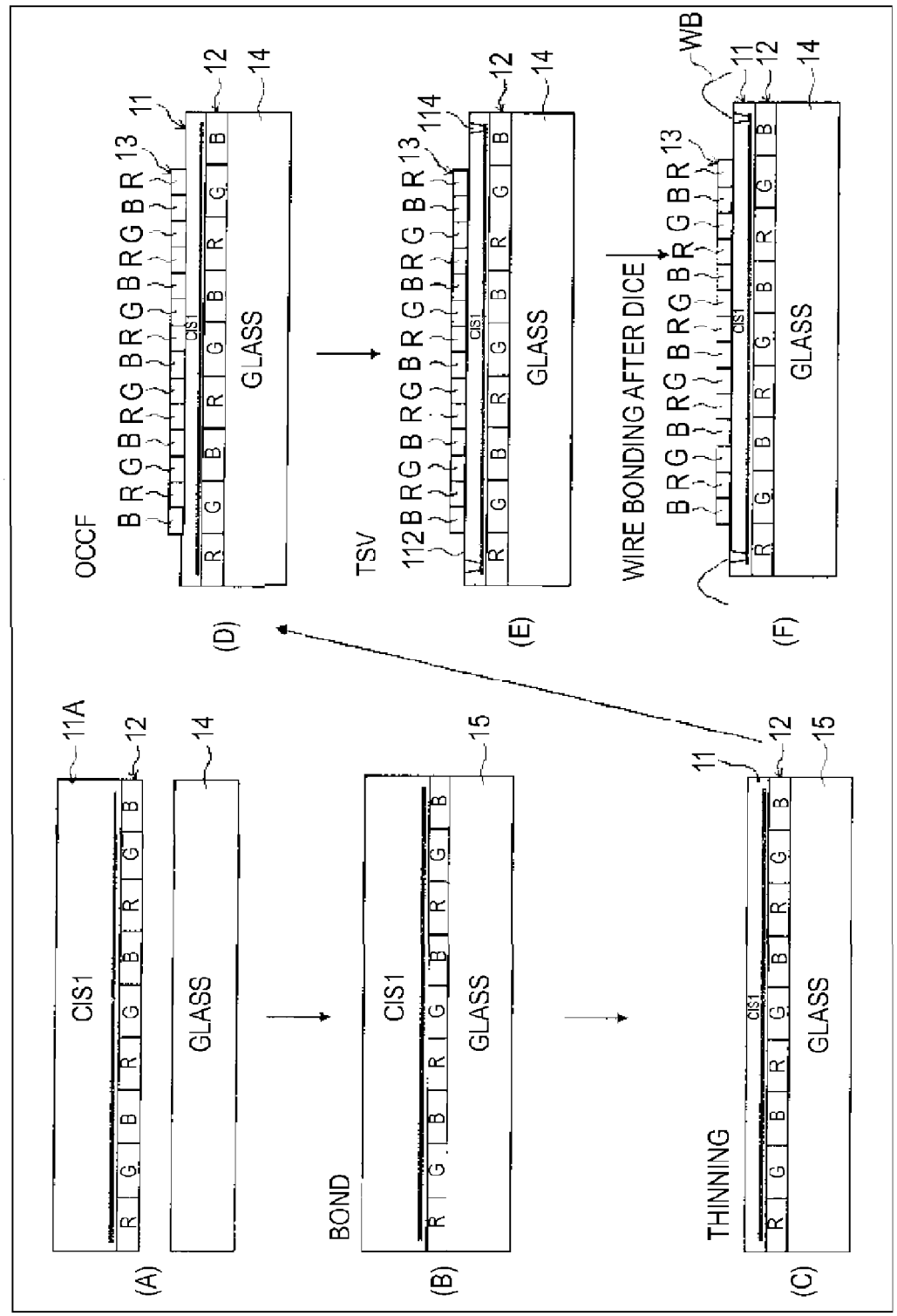
FIG. 4 is a diagram illustrating a basic method of fabricating the optical sensor according to the first embodiment.

In the sensor board 11A, after a process of forming a normal front-side sensor, as shown in FIG. 4(A), the first color filter 12 as an OCCF is formed on the first light receiving surface 111 on which the front-side sensor is formed.

Thereafter, as shown in FIG. 4(B), a transparent material for forming the transparent supporting plate 14, for example, a glass wafer 141 is bonded by an adhesive which is filled without a void.

The glass wafer 141 has a function of physically protecting the sensor wafer, similarly to the support silicon of a generic backside sensor.

Next, as shown in FIG. 4(C), the second light receiving surface side of the sensor board 11A is thinned.

Then, as shown in FIG. 4(D), the second color filter 13 as the OCCF on the second light receiving surface 112 side (back side) is formed.

Thereafter, as shown in FIGS. 4(E) and 4(F), in the case where a wire bonding WB is provided on the backside pad, a backside through via 114 is formed, thereby forming a pad electrode on the back side.

According to the first embodiment, it is possible to provide a camera with a bidirectional photography function used in a mobile phone and the like by using a single sensor device. As a result, it is possible to considerably reduce the cost of the camera module.

Further, since it is possible to photograph the front and the rear at substantially the same time, the embodiment can also be applied to a low-cost surveillance camera and the Sekai camera.

Figure 5:
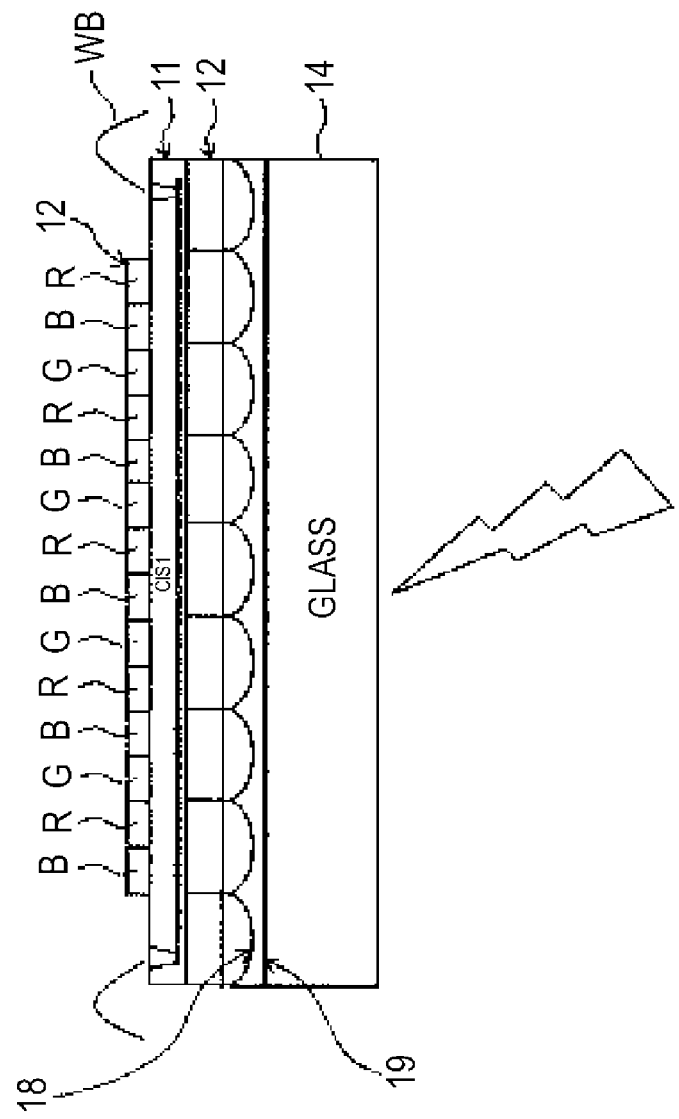
FIG. 5 is a diagram illustrating a second exemplary configuration of an optical sensor (solid-state imaging device) according to a second embodiment.

FIG. 5 is a diagram illustrating a second exemplary configuration of an optical sensor (solid-state imaging device) according to a second embodiment.

The optical sensor 10A according to the second embodiment is different from the optical sensor 10 according to the first embodiment in that micro lenses (array) 18 are formed on the bonded surface side of the first color filter 12 bonded with the transparent supporting plate 14.

In addition, in the embodiment, the micro lenses 18 are formed of a high refractive material having a high refractive-index, and an adhesive 19, which bonds the micro lenses 18 on the sensor board 11 side to the transparent supporting plate 14, is formed of a refractive material of which the refractive index is lower than that of the micro lenses 18.

As described above, the reason why the refractive index of the micro lenses 18 is made to be different from that of the adhesive 19 is as follows.

In the conventional type cavity-less structure, all of the micro lenses, the glass, and the adhesive has a refractive index of around 1.5. Therefore, the structure does not have the advantageous effect of the micro lenses, in which the sensitivity is lowered.

In contrast, similarly to the second embodiment, each micro lens 18 is made of a material with a high refractive index, and the adhesive 19 is made of a material with a low refractive index, whereby it is possible to obtain the light concentration effect of the micro lens 18.

Further, the adhesive 19, which is made of a low refractive-index material having a refractive index higher than that of the air layer, decreases the incident angle to each micro lens, and thus decreases the amount of correction for the pupil of the micro lens. With such a configuration, the effect that increases the sensitivity of the entire sensor is obtained.

Thereby, it is possible to employ a lens with a larger CRA, and thus such a configuration is advantageous in the reduction in height of a camera. Further, the micro lens 18 made of a high refractive-index material is able to prevent colors from being mixed.

Figure 6:
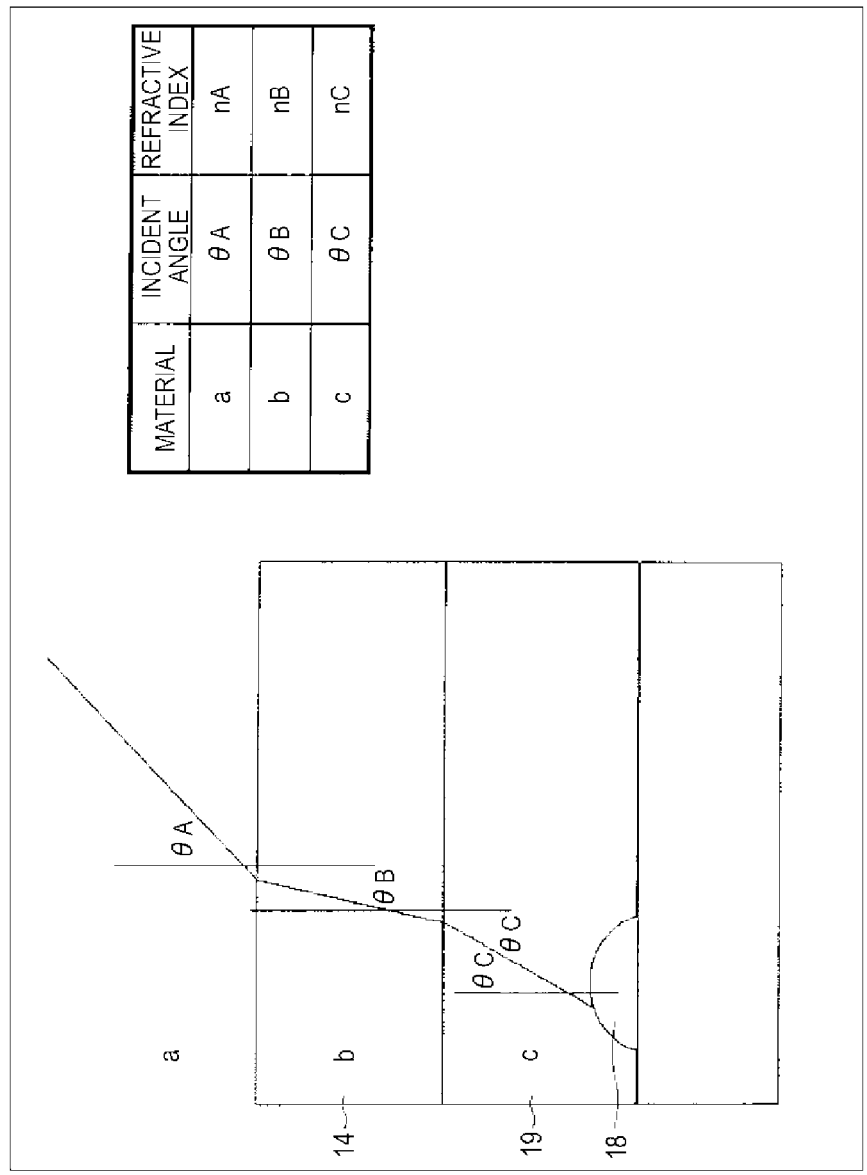
FIG. 6 is a diagram illustrating relationships between incident angles and refractive indices of an adhesive, a transparent supporting plate (glass substrate), and an air layer.

FIG. 6 is a diagram illustrating relationships between incident angles and refractive indices of an adhesive, a transparent supporting plate (glass substrate), and an air layer.

In FIG. 6, the material a represents the air layer, the material b represents the glass substrate, and the material c represents the adhesive.

The incident angle from the air layer a to the glass substrate is indicated by qA, and the refractive index of the air layer is indicated by nA.

The incident angle from the glass substrate b to the adhesive c is indicated by qb, and the refractive index of the glass substrate b is indicated by nB.

The incident angle between the adhesive c and the micro lens 18 is indicated by qc, and the refractive index of the adhesive 19 is indicated by nC.

Here, the following relationship is satisfied.

$$nA \sin θA = nB \sin θB = nC \sin θC =\_= \text{constant} \quad \text{Numerical Expression 1}$$

Here, when the relationship of nA<nC<nB is maintained, $$θA > θC > θB$$

is established.

In other words, in order of the refractive index nB of the transparent supporting plate 14($b$), the refractive index nC of the adhesive 19($c$), and the refractive index nA of the light incidence side (air layer a) of the transparent supporting plate 14, the former is higher than the latter, and then $$θA > θC > θB$$

is established.

As described above, assuming that $$θX(x=A, B, \text{ and } C)$$

is an incident angle, when this angle is small, the correction for the pupil of the micro lens is small. As a result, it is possible to reduce the dimming of the amount of ambient light and reduce color mixing between pixels.

Further, since it is possible to use the lens with a larger CRA, it is possible to use the lens with a low height.

Figure 7:
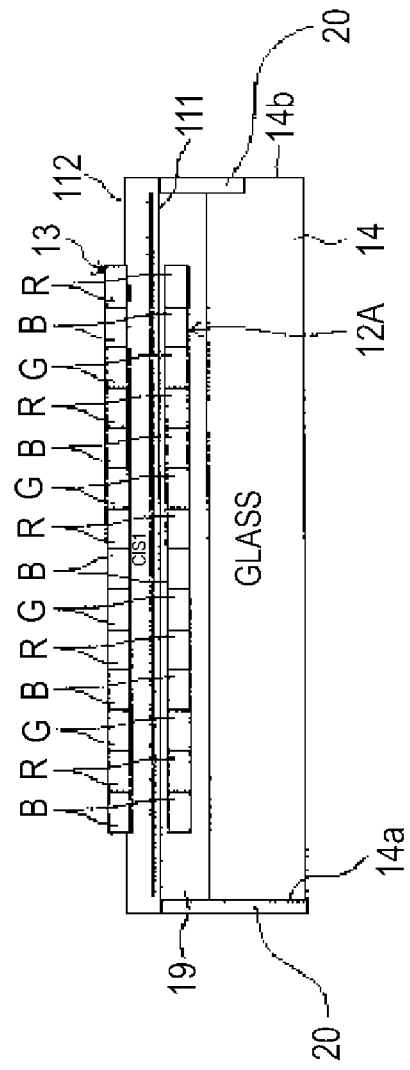
FIG. 7 is a diagram illustrating a first exemplary configuration of an optical sensor (solid-state imaging device) according to a second embodiment.

FIG. 7 is a diagram illustrating a second exemplary configuration of an optical sensor (solid-state imaging device) according to a third embodiment.

An optical sensor 10B according to the third embodiment is different from the optical sensor 10 according to the first embodiment in the following respects.

In the optical sensor 10B, the electrodes are not formed on the second light receiving surface 112 side, but through electrodes 20 are formed in the range from the first light receiving surface 111 side to side portions 14$a$ and 14$b$ of the transparent supporting plate 14.

In the third embodiment, each through electrode 20 is formed by the so-called side-wall glass via pad.

FIG. 7 shows, at the side portion 14$a$, the type which penetrates up to the light incidence surface of the transparent supporting plate 14, and shows, at the side portion 14$b$, the half-through type which penetrates in the middle of the transparent supporting plate 14.

Further, in the optical sensor 10B, both of a first color filter 12A and the second color filter 13 are formed to be high resolution sensors.

As described above, in the case of the OCCF of which both sides are the same, there is an advantage that it is not necessary to change the signal processing at the latter stage.

Further, FIG. 7 does not show the micro lenses but shows the adhesive 19.

Figure 8:
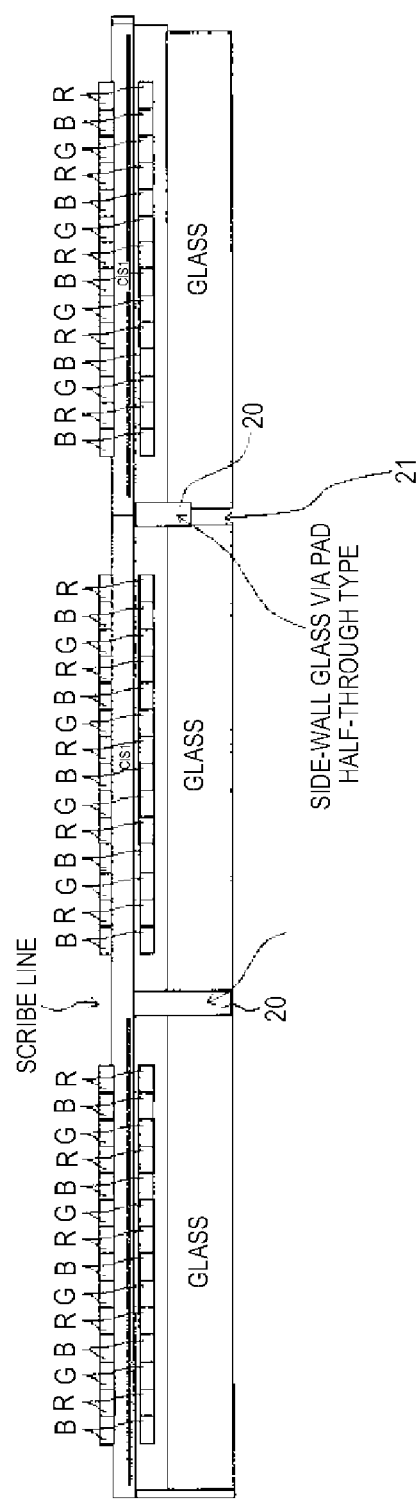
FIG. 8 is a diagram illustrating a cutout structure of the optical sensor at a wafer level according to the third embodiment.

FIG. 8 is a diagram illustrating a cutout structure of the optical sensor at the wafer level according to the third embodiment.

In this example, the through electrode 20 is formed on a scribe line SL which is cut when the wafer is divided into individual pieces, the through electrode 20 is exposed to the side wall of the transparent supporting plate 14 through scribing.

Further, FIG. 8 shows a structure which has a notch 21 for facilitating formation of a through hole through the process of forming the through electrodes 20.

In the case of employing the through electrodes 20, the through electrodes 20 are connected to the electrodes of the signal extraction board through, for example, a reflow solder.

Figure 9:
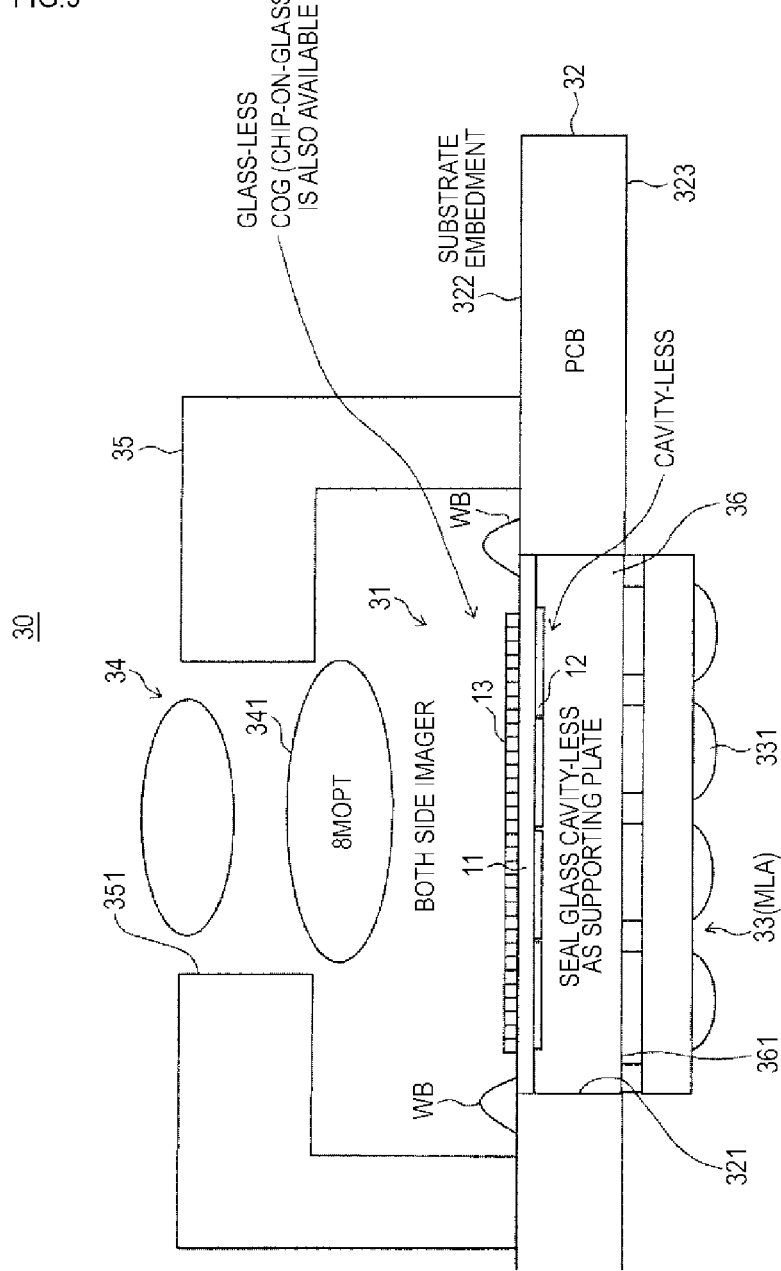
FIG. 9 is a diagram illustrating a first exemplary configuration of a lens module according to a fourth embodiment.

FIG. 9 is a diagram illustrating a first exemplary configuration of a lens module according to a fourth embodiment.

A lens module 30 according to the fourth embodiment includes an optical sensor 31, a print circuit board (PCB) 32 as the signal extraction board, a first lens 33, a second lens 34, and a lens barrel 35.

As the optical sensor 31, the optical sensor 10 according to the first embodiment is essentially employed. Accordingly, the detailed description thereof will be omitted. It should be noted that, in order to facilitate understanding, the components common to FIG. 1 will be represented by the same reference numerals and signs.

However, as the transparent supporting plate, a seal glass cavity-less 36 is employed.

The PCB 32 has a housing opening portion 321 that is formed thereon and is able to house the optical sensor 31 so as to make light incident on both sides 111 and 112 of the optical sensor 31.

The optical sensor 31 is disposed such that the second light receiving surface 112 is substantially coplanar with a first surface 322, and the pad electrodes 15 are connected to the electrodes of the PCB 32 through the wire bonding WB.

In addition, the seal glass cavity-less 36 as the transparent supporting plate is embedded so as to be filled in the space of an opening portion 321 which is formed in a range from the first light receiving surface 111 of the optical sensor 31 to a second surface 323 of the PCB 32.

A light incidence surface 361 of the seal glass cavity-less 36 is formed to be substantially coplanar with the second surface 323 of the PCB 32.

The first lens 33 is disposed on the light incidence surface 361 side of the seal glass cavity-less 36.

The first lens 33 is formed by a multi lens array (MLA) 331.

As described above, in the optical sensor 31, the OCCF with the RGB Bayer pattern is formed on the back side of the sensor of which the number of pixels is 8 million, and the OCCF with the Bayer pattern, in which four pixels are shared for each color, is formed on the front side thereof.

With such a configuration, the resolution of the front side thereof is made to be low, but the sensitivity is increased by the pixel sharing. Hence, by employing the small multi lens array 331, a camera with a lower height is realized, and it is possible to provide a camera for a different use.

The second lens 34 is formed by a condensing lens 341, which concentrates and forms an optical image of a subject incident through an opening 351 of the lens barrel 35 on the second light receiving surface 112 of the optical sensor 31, and the like.

According to the lens module of the fourth embodiment, it is possible to provide a camera with a bidirectional photography function used in a mobile phone and the like by using a single sensor device. As a result, it is possible to considerably reduce the cost of the camera module.

Further, since it is possible to photograph the front and the rear at substantially the same time, the embodiment can also be applied to a low-cost surveillance camera and the Sekai camera.

Figure 10:
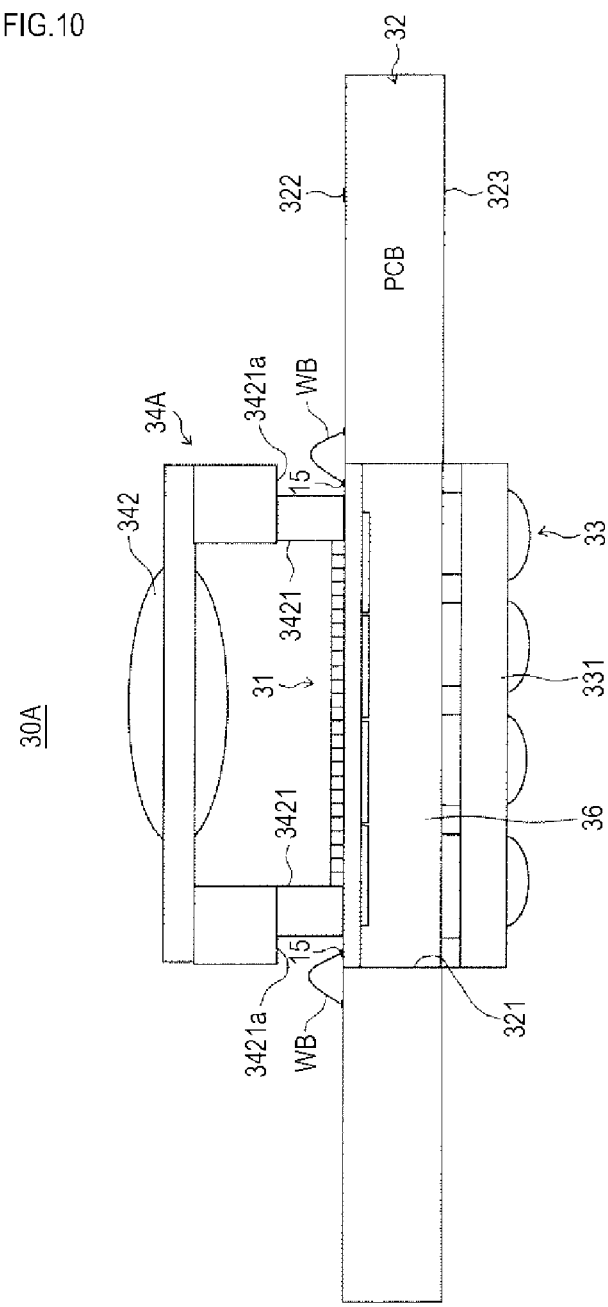
FIG. 10 is a diagram illustrating a second exemplary configuration of a lens module according to a fifth embodiment.

FIG. 10 is a diagram illustrating a second exemplary configuration of a lens module according to a fifth embodiment.

A lens module 30A according to the fifth embodiment is different from the lens module 30 according to the fourth embodiment in that the second lens 34 is formed by a wafer level lens 342 which can be processed in a wafer state.

In the wafer level lens 342 forming the second lens 34A, supporting legs 3421, which are supported by the second light receiving surface 112 side of the sensor board 11 of the optical sensor 31, are formed.

The supporting legs 3421 have notch portions 3421a which are formed to avoid the pad electrodes 15.

In addition, the connection pad electrodes 15 are connected to the electrodes of the PCB 32, which is the signal extraction board, through the wire bonding WB.

Figure 11:
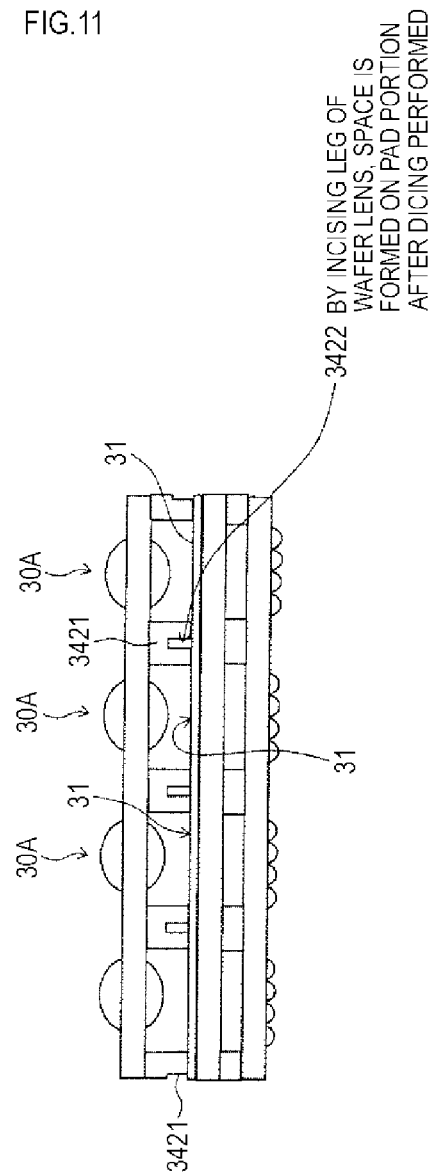
FIG. 11 is a diagram illustrating a wafer level state of the lens module of FIG. 10.

FIG. 11 is a diagram illustrating the wafer level state of the lens module of FIG. 10.

In the wafer level lens 342, a slit 3422 is formed at a boundary portion between the wafer level lens and the optical sensor 31 of the lens module 30A adjacent thereto in a state where a plurality of lenses is integrally formed at a wafer level.

The slit 3422 is formed as the notch portion 3421 at the time of cutout through dicing.

According to the lens module of the fifth embodiment, it is possible to obtain the same effect as the fourth embodiment mentioned above.

That is, according to the fifth embodiment, it is possible to provide a camera with a bidirectional photography function used in a mobile phone and the like by using a single sensor device. As a result, it is possible to considerably reduce the cost of the camera module.

Further, since it is possible to photograph the front and the rear at substantially the same time, the embodiment can also be applied to a low-cost surveillance camera and the Sekai camera.

Figure 12:
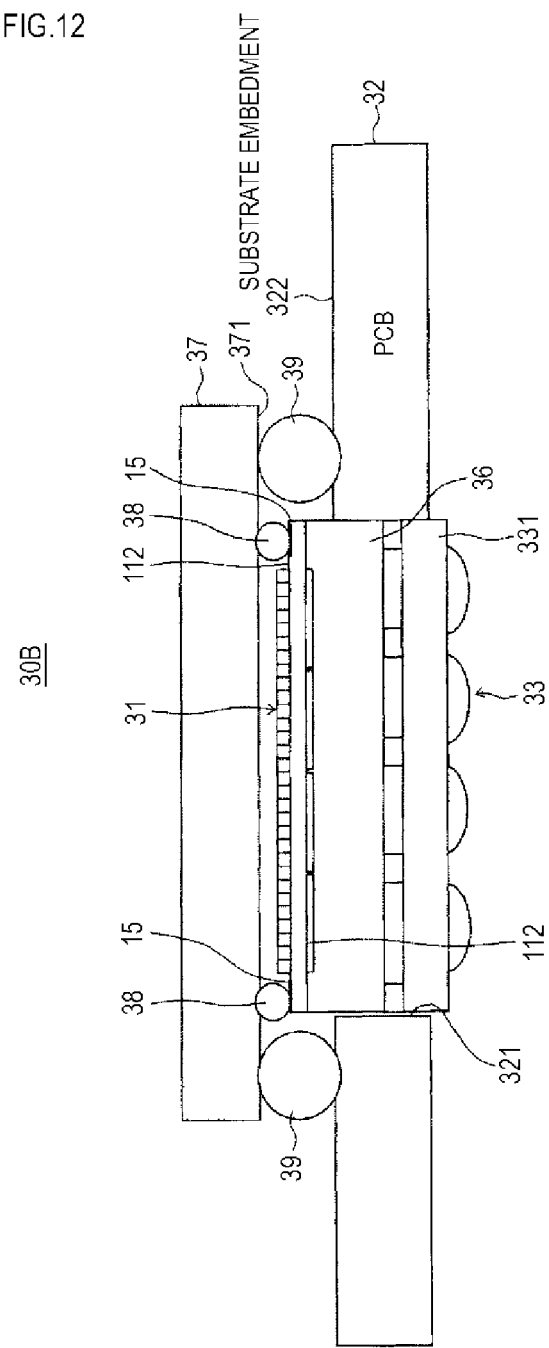
FIG. 12 is a diagram illustrating a third exemplary configuration of a lens module according to a sixth embodiment.

FIG. 12 is a diagram illustrating a third exemplary configuration of a lens module according to a sixth embodiment.

A lens module 30B according to the sixth embodiment is different from the lens modules 10 and 10A according to the first and second embodiments in that, instead of the second lens, a wiring transparent substrate 37, on which wiring is formed, is employed.

The wiring transparent substrate 37, on which the wiring is formed, is disposed such that a surface 371, on which the wiring is formed, faces the second light receiving surface 112 of the optical sensor 31.

In addition, the second light receiving surface 112 of the optical sensor 31 is formed at the layout position of the transparent substrate 37 side than the first surface 322 of the PCB 32.

In accordance therewith, a part of each supporting portion of the multi lens array 331 is disposed inside the opening portion 321 of the PCB 32.

In addition, the pad electrodes 15 of the optical sensor 31 are connected to wiring ball electrodes (bumps) 38 of the transparent substrate 37 corresponding thereto.

Moreover, the electrodes of the PCB 32 are connected to wiring ball electrodes 39 of the transparent substrate corresponding thereto.

Figure 13:
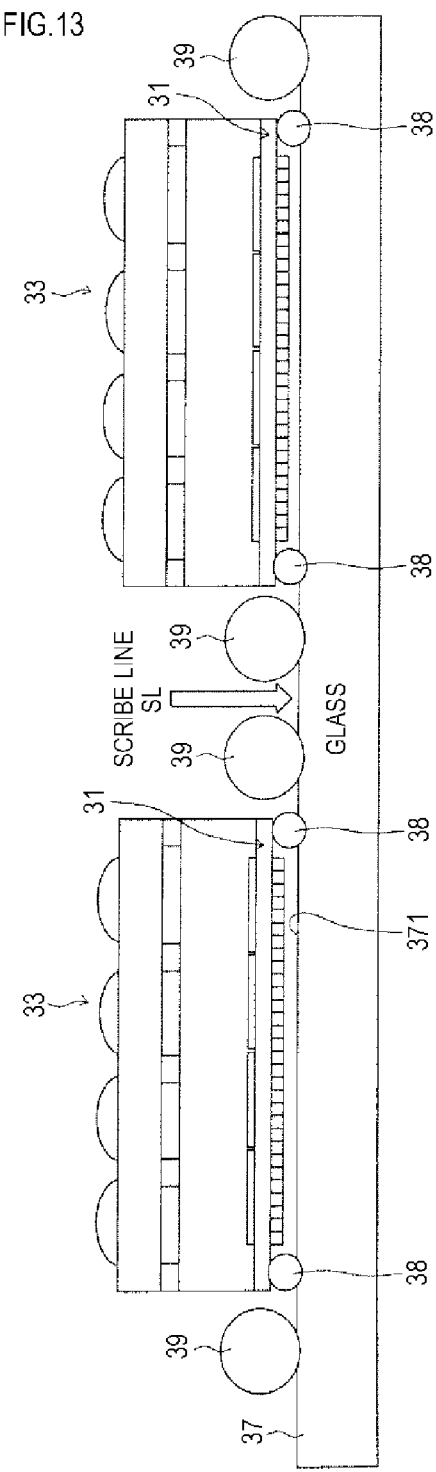
FIG. 13 is a diagram illustrating a wafer level state of the lens module of FIG. 12.

FIG. 13 is a diagram illustrating the wafer level state of the lens module of FIG. 12.

As shown in FIG. 13, in the sixth embodiment, the transparent substrate 37 is disposed on the back side, and a wire pattern is formed on the transparent substrate 37.

Then, the bump electrodes 38 are formed on the sensor wafer, the individual pieces of the sensor are attached, the solder balls 39 are connected to the extraction wires, and finally a cover glass is diced along the scribe line SL, and is cut into individual pieces.

Figure 14:
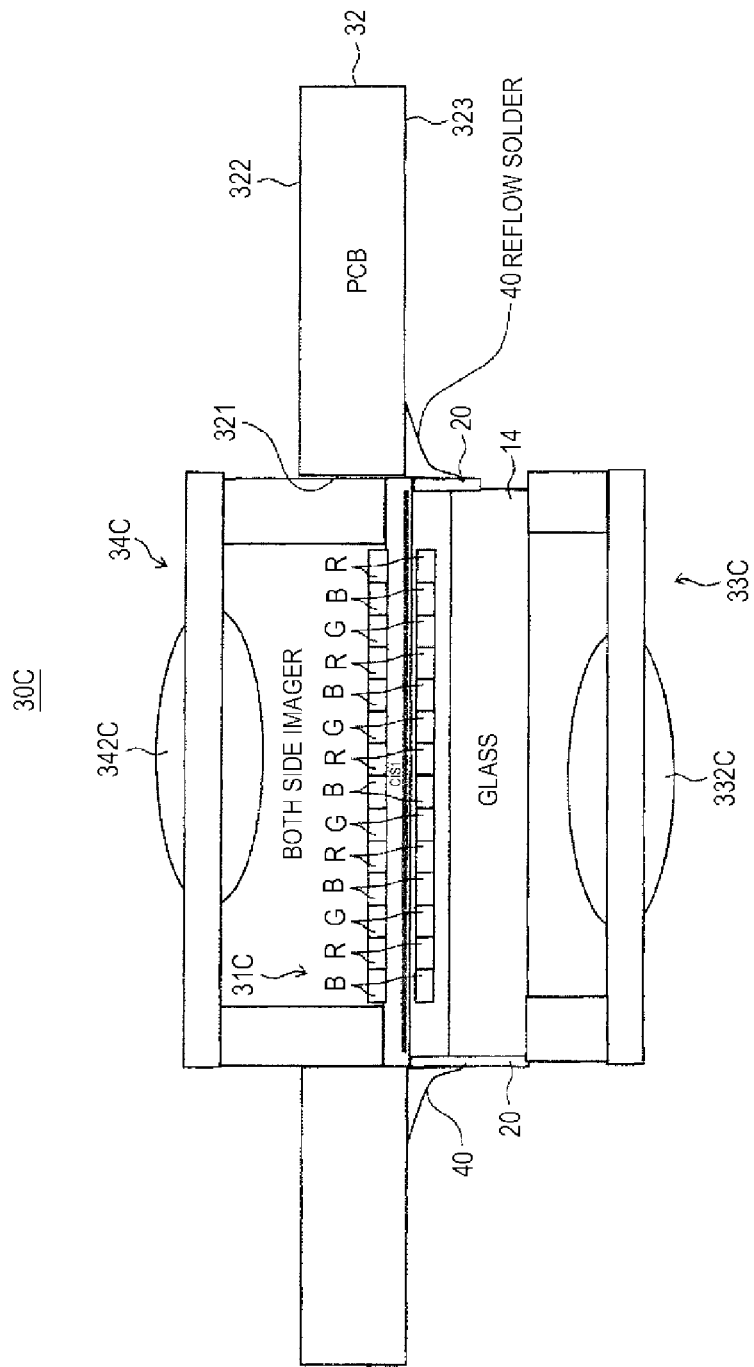
FIG. 14 is a diagram illustrating a fourth exemplary configuration of a lens module according to a seventh embodiment.

FIG. 14 is a diagram illustrating a fourth exemplary configuration of a lens module according to a seventh embodiment.

A lens module 30C according to the seventh embodiment is different from the lens modules 10 and 10A according to the first and second embodiments in the following respects.

In the lens module 30, as an optical sensor 31C, the optical sensor 10B according to the third embodiment is used as it is.

Further, the lens module is formed by wafer level lenses 332C and 342C as a first lens 33C and a second lens 34C.

In addition, the optical sensor 31C is housed in the opening portion 321 so as to be positioned to the second surface 323 of the PCB 32.

Basically, the optical sensor 31C is housed in the opening portion 321 such that the through electrodes 20 are exposed to the first lens 33C side rather than the second surface 323 of the PCB 32.

In this state, the through electrodes 20 are connected to the electrodes of the PCB 32 through the reflow solder.

Figure 15:
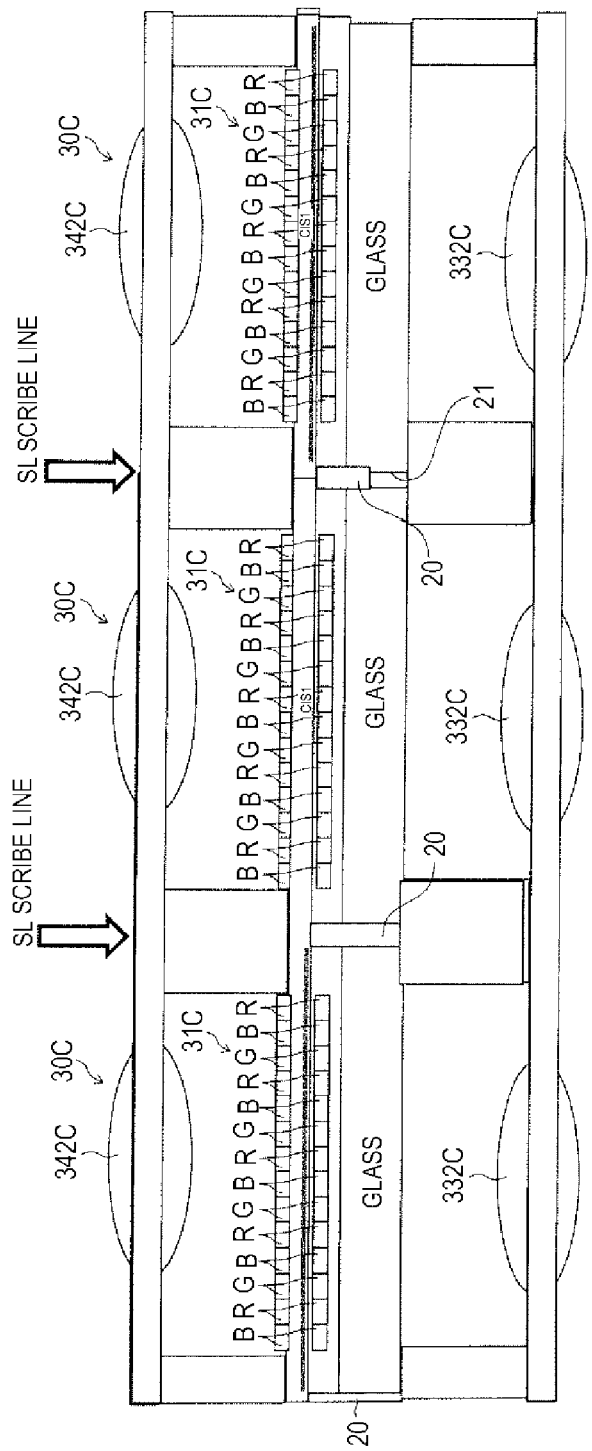
FIG. 15 is a diagram illustrating a wafer level state of the lens module of FIG. 14.

FIG. 15 is a diagram illustrating a wafer level state of the lens module of FIG. 14.

In this example, similarly to FIG. 8, the through electrode 20 is formed on a scribe line SL which is cut when the wafer is divided into individual pieces, the through electrode 20 is exposed to the side wall of the transparent supporting plate 14 through scribing.

Further, FIG. 15 shows a structure which has a notch 21 for facilitating formation of a through hole through the process of forming the through electrodes 20.

According to the lens module of the seventh embodiment, it is possible to obtain the same effect as the fourth embodiment mentioned above.

That is, according to the seventh embodiment, it is possible to provide a camera with a bidirectional photography function used in a mobile phone and the like by using a single sensor device. As a result, it is possible to considerably reduce the cost of the camera module.

Further, since it is possible to photograph the front and the rear at substantially the same time, the embodiment can also be applied to a low-cost surveillance camera and the Sekai camera.

The aforementioned lens modules 30 to 30C can be applied to a camera module capable of double-sided imaging.

FIG. 16 is a diagram illustrating an exemplary configuration of a camera module according to an eighth embodiment.

In a camera module 50, as an example, the lens module 30 of FIG. 9 is employed.

The camera module 50, in addition to a lens module 40, further includes a slide switch 51, a signal extraction electrode 52, and a signal processing unit 53.

The camera module 50 employs the slide switch 51 as a sensor change switch which is necessary when the double-sided sensor is mounted.

In the slide switch 51, an opening portion 511, which is for illuminating light on the second light receiving surface 112 side, and an opening portion 512, which is for illuminating light on the first light receiving surface 111 side, are formed.

The opening portion 511 and the opening portion 512 are formed not to overlap with each other. Accordingly, in the structure, when the sensor on one side is used, no optical signal is input to the sensor on the other side, and then the switch state is input to the signal processing unit 53, thereby performing desirable signal processing.

The signal processing unit 53 is able to change processing by detecting which one of the front side and the back side of the sensor is used in conjunction with the switch 51.

Further, the slide switch 51 is electrically controlled by an actuator and the like. Thus, by using the camera module in a surveillance camera for monitoring the front and the rear at substantially the same time or by using a fish-eye lens, 360-degrees monitoring is also possible through one device.

According to the eighth embodiment, it is possible to provide a camera with a bidirectional photography function used in a mobile phone and the like by using a single sensor device. As a result, it is possible to considerably reduce the cost of the camera module.

Further, since it is possible to photograph the front and the rear at substantially the same time, the embodiment can also be applied to a low-cost surveillance camera and the Sekai camera.

The description above provides an optical sensor, which can be used as a double-sided sensor, is capable of suppressing an increase in cost, and in which the extraction electrodes can be formed even when the wafer lenses are attached to both sides thereof, a lens module therefor, and a camera module therefor.

Accordingly, the optical sensor can be used as a double-sided sensor, whereby it is possible to suppress an increase in cost. In addition, even when the wafer lenses are attached to both sides thereof, extraction electrodes can be formed therein.

It should be understood by those skilled in the art that various modifications, combinations, sub-combinations and alterations may occur depending on design requirements and other factors insofar as they are within the scope of the appended claims or the equivalents thereof.

The invention claimed is:

1. An optical sensor comprising:
 a first light filter on a first light-receiving surface of an image sensor; and
 a second light filter on a second light-receiving surface of the image sensor, the second light-receiving surface being on an opposite side of the image sensor from the first light-receiving surface;
 wherein pixel units of the first light filter are different in size than pixel units of the second light filter.

2. The optical sensor according to claim 1, wherein the first light filter is different in layout than the second light filter.

3. The optical sensor according to claim 1, wherein the pixel units of the first light filter are different in filtering wavelength than the pixel units of the second light filter.

4. The optical sensor according to claim 1, wherein the first light filter is different in pattern than the second light filter.

5. The optical sensor according to claim 1, wherein the image sensor includes a CMOS image sensor.

6. The optical sensor according to claim 1, wherein the first light filter and the second light filter are on-chip color filters.

7. The optical sensor according to claim 1, wherein wiring formed toward the first light-receiving surface of the image sensor is connected through a via to a connection pad formed on the second light-receiving surface.

8. The optical sensor according to claim 1, further comprising:
 an infrared cut filter that overlaps the first light filter.

9. The optical sensor according to claim 1, further comprising:
 a transparent supporting plate, wherein the first light filter is disposed on the transparent supporting plate.

10. The optical sensor according to claim 9, further comprising:
 micro lenses positioned between the first light filter and the transparent supporting plate.

11. The optical sensor according to claim 10, wherein the micro lenses are bonded to the transparent supporting plate with an adhesive.

12. The optical sensor according to claim 11, wherein the micro lenses are formed of a material having a higher refractive index than the adhesive.

13. The optical sensor according to claim 9, wherein wiring formed toward the first light-receiving surface of the image sensor is connected to a side-wall glass via pad by a through electrode that penetrates through a portion of the transparent supporting plate.

14. The optical sensor according to claim 9, wherein the transparent supporting plate is between the first light filter and a first lens.

15. The optical sensor according to claim 14, wherein the first lens is a multi lens array.

16. The optical sensor according to claim 15, wherein the second light filter is between the image sensor and a second lens.

17. The optical sensor according to claim 16, wherein the second lens is a condenser lens positioned within a lens barrel.

18. The optical sensor according to claim 1, wherein the image sensor is a double-sided image sensor.

19. A camera device comprising:
 an optical sensor comprising:
  a first light filter on a first light-receiving surface of an image sensor; and
  a second light filter on a second light-receiving surface of the image sensor, the second light-receiving surface being on an opposite side of the image sensor from the first light-receiving surface;
  wherein characteristics of the first light filter are different than characteristics of the second light filter,
  wherein pixel units of the first light filter are different in size than pixel units of the second light filter.

* * * * *